United States Patent [19]

Conner

[11] Patent Number: 4,539,709
[45] Date of Patent: Sep. 3, 1985

[54] MEASUREMENT OF OSCILLATOR SPILLOVER NOISE IN A SINGLE SIDEBAND SYSTEM

[75] Inventor: William A. Conner, Plano, Tex.

[73] Assignee: Rockwell International Corporation, El Segundo, Calif.

[21] Appl. No.: 586,534

[22] Filed: Mar. 5, 1984

[51] Int. Cl.³ .............................................. H04B 17/00
[52] U.S. Cl. ....................................... 455/67; 455/47; 324/57 N
[58] Field of Search .................... 455/47, 63, 67, 115, 455/295, 296, 1; 324/57 N

[56] References Cited

U.S. PATENT DOCUMENTS

| | | | |
|---|---|---|---|
| 2,658,992 | 11/1953 | Byrne | 455/1 |
| 3,619,774 | 11/1971 | Landwehr | 324/57 N |
| 3,969,675 | 7/1976 | Gosling | 455/47 |
| 4,012,737 | 3/1977 | Waer et al. | 455/296 |

Primary Examiner—Jin F. Ng
Attorney, Agent, or Firm—V. Lawrence Sewell; H. Fredrick Hamann

[57] ABSTRACT

A method for measuring oscillator spillover noise produced by a single sideband microwave radio is provided. A white noise signal filtered by a narrow notch filter having a bandwidth on the order of the spillover bandwidth is applied as a modulating input. The white noise signal filtered by wide notch filter is also applied as a modulating input. After demodulation, noise measurements are made in the narrow and wide notches. Because the wide notch contains practically no oscillator spillover noise near its center, the noise measured there can be subtracted from that measured in the narrow notch to provide a figure for the oscillator spillover noise. Idle noise can be subtracted from the wide notch noise value to provide a measure of intermodulation distortion.

3 Claims, 5 Drawing Figures

MEASUREMENT OF OSCILLATOR SPILLOVER NOISE IN A SINGLE SIDEBAND SYSTEM

BACKGROUND OF THE INVENTION

This invention relates to the measurement of oscillator spillover noise produced in a single sideband radio system and to the determination of the contribution of intermodulation distortion to noise produced in the system.

In designing and manufacturing single sideband microwave radio systems, it is found that oscillators in the frequency translation process introduce a noise component, which can be termed "oscillator spillover noise". This noise component arises because the oscillator is not perfectly stable. The noise can be observed when a pure tone is applied as a modulating input to a transmitter. The output of the transmitter, instead of having energy only at a single microwave frequency, as would be ideal, has some energy in a relatively small bandwidth about the single frequency. This spillover bandwidth is indeed relatively small; for most microwave oscillators suitable for practical single sideband systems, the majority of the noise is within 100 KHz of the single microwave frequency.

It is important to measure oscillator spillover noise in the design, manufacture and maintenance of single sideband radios, in order to obtain the best performance from the radio. To make this measurement, the amount of oscillator spillover noise must be determined in the presence of other forms of noise, including intermodulation distortion. In the past, the amount of such noise has been determined by measuring phase noise and integrating spillover effects into a quiet channel. This method, in general, is quite tedious.

The present invention provides an easier method of measuring oscillator spillover noise and permits determination of the amount of intermodulation distortion present.

SUMMARY OF THE INVENTION

In accordance with the present invention, there is provided a relatively simple but effective method of measuring oscillator spillover noise in a single sideband radio. A test signal, such as band-limited white noise, which simulates a baseband input, is filtered with a narrow notch filter having a bandwidth on the order of the spillover bandwidth at baseband frequencies. The filtered test signal is used as a modulating input to a transmitter of a radio to be tested. The output of the transmitter is applied to the receiver of the radio, and a noise measurement is made in the demodulated output of the receiver in the band of the notched filter. An important component of the measured noise will be oscillator spillover noise. The above process is repeated, except that the test signal is filtered with a wide notch filter having a bandwidth at least several times the spillover bandwidth. When a noise measurement is made in the demodulated output in the band of the wide notch filter, oscillator spillover noise will not be a significant component, because such noise will be confined to the edges of the wide notch. The noise measured in the narrow notch can be reduced by the noise measured in the wide notch to obtain a measure of oscillator spillover noise.

Additionally, a noise measurement can be made of the demodulated output, when there is no modulating signal into the transmitter, thereby providing a measurement of the radio noise in the unloaded or idle condition. If the noise measured in the wide notch is decreased by the idle noise, there is obtained a measure of intermodulation distortion for the radio.

DESCRIPTION OF A PREFERRED EMBODIMENT

Figure 1:
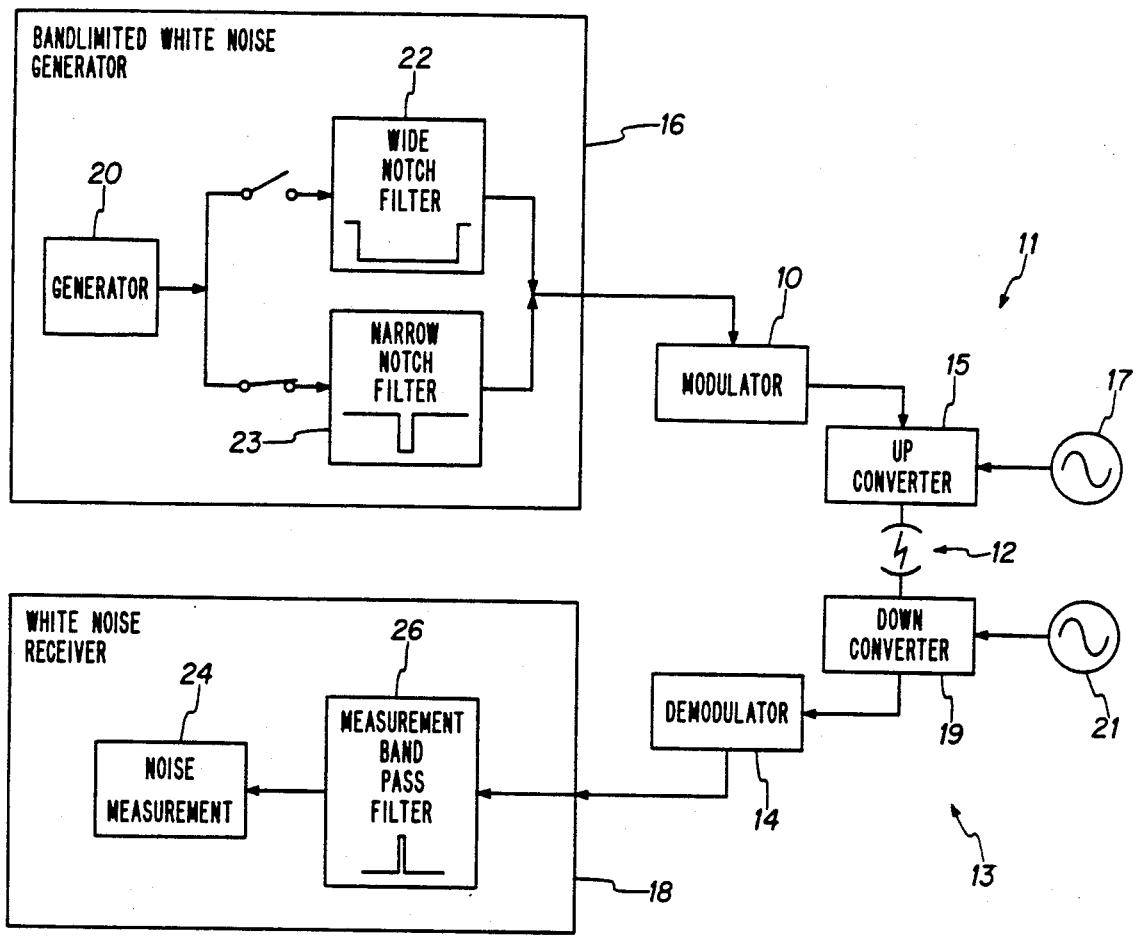
FIG. 1 is a block diagram of an apparatus used to implement the invention.

In FIG. 1 there is illustrated apparatus for implementing the invention. To be measured are noise components of a radio comprised of transmitter 11 and receiver 13. Transmitter 11 includes a modulator 10 and an upconverter 15 driven by an oscillator 17. Receiver 13 includes downconverter 19, and associated oscillator 21 and demodulator 14. It is the combination of oscillators 17 and 21 which contribute to the oscillator spillover noise described herein. As illustrated, the transmitter and receiver are connected to antennas forming a radio link 12 between them. This would be a natural arrangement for testing according to the principles of the invention. For example, the invention can be used to determine the average noise produced by the transmitters and receivers in a multiple hop microwave link. It is of course possible in a laboratory or a production testing environment to connect the output of transmitter 11 through an attenuator to the input of receiver 13, if advantageous.

Figure 2A:
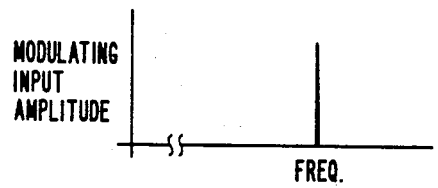
FIGS. 2a & 2b include two amplitude spectra illustrating the phenomenon of oscillator spillover noise.
Figure 2B:
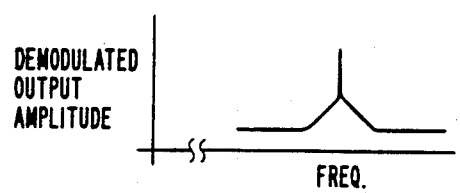

The nature of oscillator spillover noise is illustrated in FIG. 2. In FIG. 2a, there is illustrated the single frequency ideal transmitter output in response to a single tone modulating input. Since the frequency of the oscillator in a transmitter is not perfectly stable, some output energy appears at frequencies adjoining the single frequency of the ideal output. FIG. 2b illustrates the noisy output and is intended to show that the noise energy is not wideband, but distributed closely about the desired single frequency.

The test system used to implement the invention employs a commercially available white noise generator 16 and white noise receiver 18. The generated white noise simulates a baseband input signal and is accordingly band limited to the appropriate baseband frequency range. The generator 16 includes the white noise generator 20 itself and wide and narrow notch filters 22 and 23, respectively. In the measurement to be described, the filters can be employed either at the same time or sequentially. If the filters 22 and 23 are centered about the same frequency, they should be employed sequentially. However, if white noise generator 16 provides, for example, a wide notch filter 22 centered about 10,912 KHz, and narrow notch filter 23 centered about 11,700 KHz, then the connection of the filters can be as shown, or they can be in series. These factors will be apparent to those skilled in the art from the description of the role of filters 22 and 23 which follows below. The output of white noise generator 16 is applied as a modulating input to the modulator 10.

The output of transmitter 11, including noise introduced by the oscillator, is applied to receiver 13. In the process of down conversion, oscillator 21 contributes further spillover noise. The demodulated output of receiver 13 is applied to white noise receiver 18. Noise measurement circuitry 24 measures noise present in the demodulated output in a very narrow measurement band passed by filter 26. This measurement band is picked to lie near the middle of the notch filter 22 or 23 which is being used. It is apparent that if notch filters 22 and 23 are centered about different frequencies, then two measurement bandpass filters like filter 26 will be required.

Figure 3:
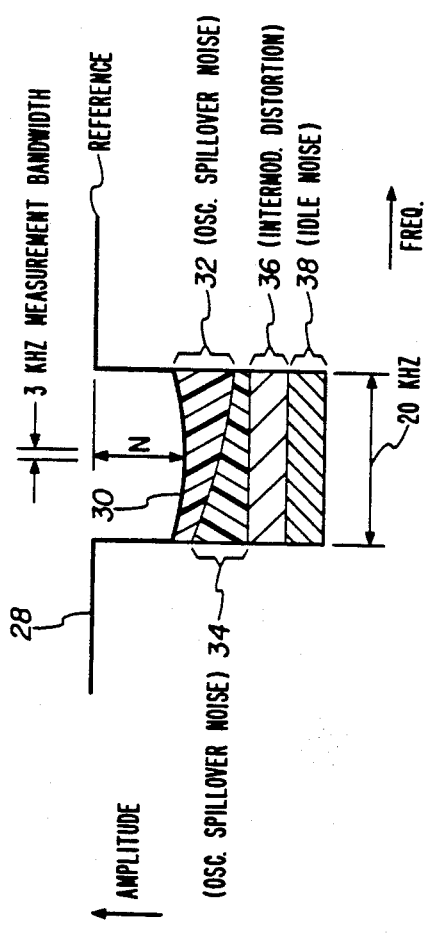
FIG. 3 is an amplitude spectrum illustrating components contributing to noise measured in accordance with the teachings of the invention.

In one of the measurements to be made in practicing the invention, white noise from generator 20 is filtered by narrow notch filter 23 and applied as a modulating input to modulator 10. Noise in the output of demodulator 14 is measured in the measurement band by white noise receiver 18. FIG. 3 is a somewhat schematic amplitude spectrum of the demodulated output in the region of the narrow notch. Level 28 in the figure is the amplitude of the demodulated output outside the notch filtered region. This becomes the reference value for the noise measurements according to the invention. Level 30 is the noise level near the center of the narrow notch. Level 30 is formed by the addition of various noise components which are cross hatched to distinguish them. The topmost component 32 represents oscillator spillover noise associated with frequencies above the narrow notch. Component 34 is oscillator spillover noise contributed by output frequencies below the notch. Component 36 is intermodulation distortion. Component 38 represents idle noise, that is, noise present in the absence of a modulating input.

The width of the narrow notch should be on the order of the bandwidth (at baseband frequencies) of the oscillator spillover noise, that is, such that the oscillator spillover noise components 32 and 34 make a substantial contribution to the noise measured in the notch. For example, in a tested embodiment the center of the narrow notch was at 11,700 KHz and the width of the narrow notch was 20 KHz. The measurement bandwidth used in the center of the notch was 3 KHz. White noise receiver 18 can provide a measurement of the noise level in the measurement bandwidth at the center of the notch with respect to the reference, this noise value being illustrated by the distance N in FIG. 3.

Figure 4:
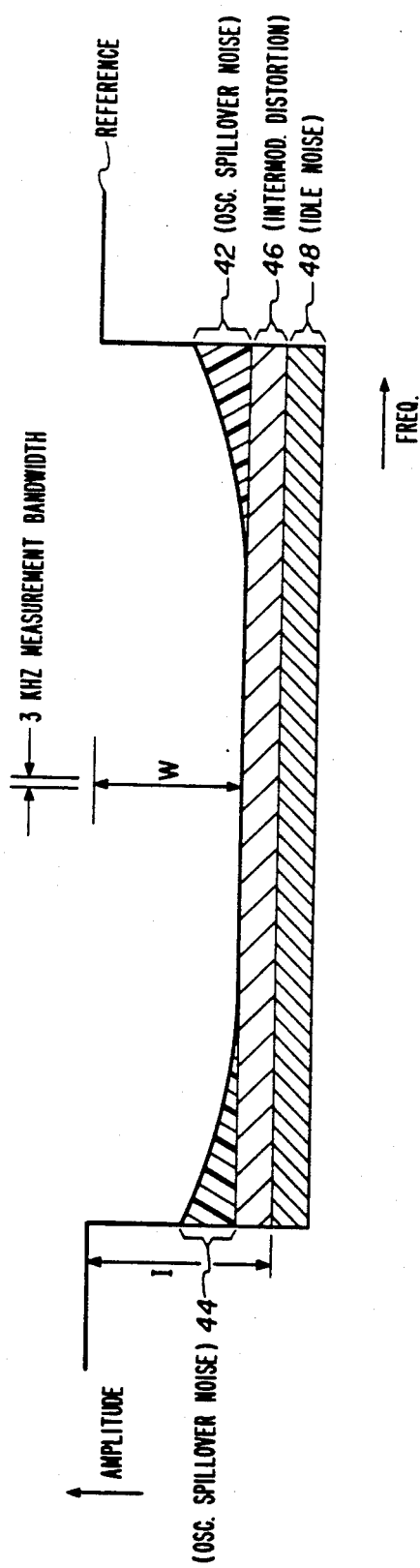
FIG. 4 is an amplitude spectrum illustrating components contributing to another noise measurement in accordance with the teachings of the invention.

In FIG. 4, the white noise applied as a modulating input to modulator 10 is filtered by wide notch filter 22. The noise in the measurement band near the center of the notch, or at least away from the edges of the notch, is again measured with respect to the reference level, this measurement being illustrated by distance W in the figure. In the wide notch, component 42 represents oscillator spillover noise contributed by frequencies above the notch, while component 44 is oscillator spillover noise associated with frequencies below the notch. Component 46 is intermodulation distortion. Component 48 is idle noise.

As can be seen readily from FIG. 4, if the wide notch is at least several times the bandwidth of the oscillator spillover noise, such noise makes little or no contribution near the center of the wide notch. Thus, measurement W is a measurement of intermodulation distortion plus idle noise. This permits the amount of oscillator spillover noise to be determined separate from intermodulation distortion and idle noise.

Idle noise is measured by white noise receiver 18 at the output of demodulator 14, while transmitter 11 is operated without a modulating input signal.

The determination of oscillator spillover noise from the measured figures will be illustrated by example. In the example, it will be assumed that the narrow notch noise value, N, is 42 dB, the wide notch noise value, W, is 43 dB, and the idle noise measurement, represented by I, is 44.5 dB. Equation 1 computes the oscillator spillover noise OSN in accordance with well understood formulas for computing differences in decibel levels.

$$OSN = -10 \log (10^{-0.1N} - 10^{-0.1W})$$

$$OSN = 48.8 \text{ dB} \quad (1)$$

Equation 2 similarly provides the intermodulation distortion IM.

$$IM = -10 \log (10^{-0.1W} - 10^{-0.1I})$$

$$IM = 48.4 \text{ dB} \quad (2)$$

Equation 1 reduces the noise measured in the narrow notch by the noise measured in the wide notch to provide a measure of oscillator spillover noise. Of course, a larger number is generated, because of the way that noise measurements are expressed in dB. Equation 2 reduces the noise measured in the wide notch by the idle noise to derive a value for intermodulation distortion. It will be apparent that the computations could be made somewhat differently; for example, the noise in the narrow notch could be first reduced by the amount of the idle noise and then further reduced by the amount of the intermodulation distortion. Such computations are equivalent to those of equations 1 and 2.

The determination of oscillator spillover noise and intermodulation distortion as described above is considerably simpler than the methods of the prior art. As a result, quality measurements necessary in the design, manufacture and maintenance of single sideband radio systems are more readily performed.

I claim:

1. A method of measuring the performance of a single sideband transmitter and receiver which generate oscillator spillover noise lying in a spillover bandwidth at baseband frequencies, comprising the steps of:
   (a) generating a test signal which simulates a baseband input signal,
   (b) filtering the test signal with a narrow notch filter having a bandwidth on the order of said spillover bandwidth,
      applying the filtered test signal as a modulating input to said transmitter,
      applying the transmitter output to said receiver, and
      measuring noise in the receiver demodulated output in the band of the notch filter;
   (c) filtering said test signal with a wide notch filter having a bandwidth at least several times said spillover bandwidth,
      applying the wide notch filtered test signal as a modulating input to said transmitter,
      applying to the receiver the output of the transmitter in response to the wide notch filtered test signal, and measuring noise in the resulting receiver demodulated output in the band of said wide notch filter but away from the edges of the wide notch; and (d) reducing the noise measured in said narrow notch by the noise measured in said wide notch to derive a measure of said oscillator spillover noise.

2. The method of claim 1, additionally comprising the steps of:

applying to the receiver the output of the transmitter while there is no modulating signal input thereto, and measuring noise in the resulting receiver output; and reducing the noise measured in said wide notch by the noise measured without a modulating input, to derive a measure of intermodulation distortion.

3. A method of measuring the performance of a single sideband transmitter and receiver which generate oscillator spillover noise lying in a spillover bandwidth at baseband frequencies, comprising the steps of:

(a) generating a test signal which simulates a baseband input signal, (b) filtering the test signal with a wide notch filter having a bandwidth at least several times said spillover bandwith, applying the wide notch filtered test signal as a modulating input to said transmitter, applying the transmitter output to said receiver, and measuring noise in the receiver demodulated output in the band of the notch filter;

(c) applying to the receiver the output of the transmitter while there is no modulating signal input thereto, and measuring noise in the resulting receiver demodulated output; and (d) reducing the noise measured in said wide notch by the noise measured without a modulating input, to derive a measure of intermodulation distortion.

* * * * *